(12) United States Patent
Mou et al.

(10) Patent No.: US 9,548,297 B2
(45) Date of Patent: Jan. 17, 2017

(54) SEMICONDUCTOR DEVICE AND METHOD FOR MANUFACTURING SAME

(75) Inventors: Liangwei Mou, Jiangsu (CN); Zhaoxing Huang, Jiangsu (CN); Xuelei Chen, Jiangsu (CN); Li Wang, Jiangsu (CN); Zhewei Wang, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 54 days.

(21) Appl. No.: 14/238,095

(22) PCT Filed: Jul. 31, 2012

(86) PCT No.: PCT/CN2012/079456
§ 371 (c)(1),
(2), (4) Date: Feb. 10, 2014

(87) PCT Pub. No.: WO2013/020470
PCT Pub. Date: Feb. 14, 2013

(65) Prior Publication Data
US 2014/0167126 A1    Jun. 19, 2014

(30) Foreign Application Priority Data
Aug. 10, 2011    (CN) .......................... 2011 1 0228429

(51) Int. Cl.
*H01L 27/04*    (2006.01)
*H01L 29/66*    (2006.01)
(Continued)

(52) U.S. Cl.
CPC .............. *H01L 27/04* (2013.01); *H01L 28/60* (2013.01); *H01L 29/66477* (2013.01); *H01L 27/0629* (2013.01)

(58) Field of Classification Search
USPC ........................................................ 257/296
See application file for complete search history.

(56) References Cited

U.S. PATENT DOCUMENTS

2003/0038313 A1*    2/2003    Furuhata ....................... 257/296
2003/0049905 A1    3/2003    Nitaa et al.
2007/0148856 A1*    6/2007    Shin .................... H01L 27/0629
                                                438/238

FOREIGN PATENT DOCUMENTS

CN    1964051 A    5/2007
CN    1975988 A    6/2007
(Continued)

*Primary Examiner* — Zandra Smith
*Assistant Examiner* — Lawrence Tynes, Jr.
(74) *Attorney, Agent, or Firm* — Muncy, Geissler, Olds & Lowe, P.C.

(57) ABSTRACT

Provided are a semiconductor device and a method of manufacturing the same. The semiconductor device includes a substrate and a PIP capacitor located. The PIP capacitor includes a first polysilicon layer, a metallic silicide layer, a protective layer, a dielectric layer, and a second polysilicon layer, which have a lower conductive plate pattern and are successively arranged. The method includes: providing a substrate; successively forming a first polysilicon layer, a metallic silicide, and a protective layer on the substrate; transferring a lower conductive plate pattern into the first polysilicon layer, the metallic silicide layer, and the protective layer, thus forming the first polysilicon layer, the metallic silicide layer, and the protective layer having the lower conductive plate pattern; successively forming a dielectric layer and a second polysilicon layer having a lower conductive plate pattern on the protective layer. The capacitance and reliability of the PIP capacitor are improved.

3 Claims, 8 Drawing Sheets

(51) Int. Cl.
*H01L 49/02* (2006.01)
*H01L 27/06* (2006.01)

(56) References Cited

FOREIGN PATENT DOCUMENTS

| | | | |
|---|---|---|---|
| CN | 101399205 | 4/2009 | |
| CN | 102024809 A | 4/2011 | |
| CN | 102074466 A | 5/2011 | |
| CN | 102931239 A * | 2/2013 | ............. H01L 28/60 |

* cited by examiner

SEMICONDUCTOR DEVICE AND METHOD FOR MANUFACTURING SAME

FIELD OF THE INVENTION

The present disclosure relates to a field of manufacturing a semiconductor device, more particularly relates to a semiconductor device and method of manufacturing the same.

BACKGROUND OF THE INVENTION

With the rapid development of semiconductor devices, the market competition is becoming more and more fierce, one of the main methods to prolong the service life of the products is to constantly reduce the area of the die. In the Mixed-Signal Circuit, the proportion of the capacitor area in the chip is considerable, thus manufacturing a capacitor having a high performance and high capacity is an inevitable trend of the development of the semiconductor device.

The capacitor in the semiconductor device can be divided into PIP capacitors (the upper and lower conductive plates are made of polysilicon, the intermediate layer is an insulator layer), MIM capacitors (the upper and lower conductive plates are made of metal, the intermediate layer is an insulator layer), and MIP capacitors (the upper conductive plate is made of metal, the lower conductive plate is made of polysilicon, the intermediate of layer is an insulator layer). As regarding to the PIP capacitor, after the lower conductive plate polysilicon is formed, in order to reduce the contact resistance of the device and improve the operating speed of the device, a metallic silicide (such as WSi) is usually formed on the lower conductive plate polysilicon, then an insulator layer (also known as the dielectric layer) is formed on the metallic silicide, and the upper plate polysilicon is formed on the insulator layer, thus the manufacture of the PIP capacitor is completed.

In the prior art, there are two methods for manufacturing PIP capacitor on the semiconductor device, which are as follows:

The first process includes the steps of: 1. forming the lower conductive plate polysilicon and the metallic silicide layer on the lower conductive plate polysilicon; 2. forming the source and the drain; 3. forming the insulator layer; 4. forming the upper plate polysilicon.

The second process includes the steps of: 1. forming the lower conductive plate polysilicon and the metallic silicide layer; 2. forming the insulator layer; 3. forming the upper plate polysilicon; 4. forming the source and the drain.

In the two processes, the capacitance of the PIP capacitor formed by the first process is generally small, the capacitance cannot be increased to 1.8 ff/m$^2$ even though reducing the thickness of the insulator layer; the capacitance of the PIP capacitor formed by the second process can increased to 1.8 ff/m$^2$, however, the PIP capacitor has a poor reliability.

SUMMARY OF THE INVENTION

Accordingly to this, the present disclosure is directed to a semiconductor device and a method of manufacturing the semiconductor device so as to improve the capacitance and the reliability of the PIP capacitor.

To achieve the above object, a technical solution is provided in the present disclosure:

A semiconductor device includes:
a substrate;
a PIP capacitor located on the substrate;
in which, the PIP capacitor comprises: a first polysilicon layer, a metallic silicide layer, a protective layer, a dielectric layer, and a second polysilicon layer, which have a lower conductive plate pattern and are arranged successively from bottom to top.

Preferably, in the semiconductor device, the protective layer is a third polysilicon layer.

Preferably, in the semiconductor device, a thickness of the protective layer is 100 Å to 500 Å.

Preferably, in the semiconductor device, the dielectric layer is a single dielectric layer or a stacked dielectric layer.

Preferably, in the semiconductor device, the dielectric layer is the stacked dielectric layer, and the dielectric layer comprises a bottom silicon oxide layer, a middle silicon oxide layer, and a top silicon oxide layer arranged successively from bottom to top.

Preferably, in the semiconductor device, Preferably, in the semiconductor device, the metallic silicide layer is a WSi layer.

Preferably, the semiconductor device further includes a source region and a drain region located in the substrate.

Preferably, the semiconductor device further includes a sidewall located on both sides of the first polysilicon layer, the metallic silicide layer, and the protective layer having a lower conductive plate pattern; wherein the source region and the drain region are located on both sides of the sidewall.

A method of manufacturing a semiconductor device is provided in the present disclosure, which includes the steps of:

providing a substrate;

forming a first polysilicon layer, a metallic silicide layer, and a protective layer on the substrate, successively;

transferring a lower conductive plate pattern into the first polysilicon layer, the metallic silicide layer, and the protective layer, thus forming the first polysilicon layer, the metallic silicide layer, and the protective layer having the lower conductive plate pattern; and forming a dielectric layer and a second polysilicon layer having a lower conductive plate pattern on the protective layer having the lower conductive plate pattern, successively.

Preferably, in the method, after forming the first polysilicon layer, the metallic silicide layer, and the protective layer having the lower conductive plate pattern, and before forming the dielectric layer, and the second polysilicon layer having the lower conductive plate pattern, the method further includes:

forming a source region and a drain region in the substrate.

Preferably, in the method, after successively forming the dielectric layer, and the second polysilicon layer having the lower conductive plate pattern on the protective layer having the lower conductive plate pattern, the method further includes:

forming a source region and a drain region in the substrate.

Preferably, in the method, a thickness of the protective layer is 100 Å to 500 Å.

Preferably, the first polysilicon layer, the metallic silicide layer, and the protective layer are arranged successively from bottom to top.

As can be seen from the foregoing technical solution that, the method of manufacturing a semiconductor device provided in the present disclosure includes: a substrate is provided; a first polysilicon layer, a metallic silicide layer, and a protective layer are successively formed on the substrate; a lower conductive plate pattern is transferred into the first polysilicon layer, the metallic silicide layer, and the protective layer, thus the first polysilicon layer, the metallic silicide layer, and the protective layer are formed, which have the lower conductive plate pattern; a protective layer, and a dielectric layer having a lower conductive plate pattern are formed successively on the protective layer having the lower conductive plate pattern. In the method of manufacturing the semiconductor device, the protective layer is formed on the metallic silicide layer, thus the damage of the metallic silicide layer during the subsequent etching or heat treatment can be avoided; and the obtained PIP capacitor has a higher capacitance and reliability.

BRIEF DESCRIPTION OF THE DRAWINGS

The components in the drawings are not necessarily drawn to scale, the emphasis instead being placed upon clearly illustrating the principles of the present disclosure. The following drawings provides specific details for a thorough understanding of and enabling description for these embodiments.

DETAILED DESCRIPTION OF THE EMBODIMENTS

Illustrative embodiments of the disclosure are below. The following explanation provides specific details for a thorough understanding of and enabling description for these embodiments. It is apparent to those skilled in the art that a variety of modifications and changes may be made without departing from the scope of the present disclosure.

As described in the background section, there are two methods for manufacturing PIP capacitor on the semiconductor device. The capacitance of the PIP capacitor formed by the first process is generally small. The capacitance of the PIP capacitor formed by the second process can be improved, however, the PIP capacitor has a poor reliability.

It has been found out that: when the PIP capacitor is formed on the semiconductor device according to the conventional techniques, the reason causing the low capacitance or the reliability of the capacitor lies in that: the metallic silicide layer is formed on the lower conductive plate polysilicon of the PIP capacitor, the metallic silicide layer can be effected during the subsequent etching or heat treatment; the surface of the metallic silicide layer is prone to be warped, scratched or uneven; the capacitance and the reliability of the PIP capacitor are directly effected by the damage of the metallic silicide layer.

According to this, the present disclosure provides a semiconductor device and a method of manufacturing the semiconductor device to solve the problem of low capacitance and reliability of the PIP capacitor formed on the semiconductor device in the prior art. The semiconductor device and the method of manufacturing the semiconductor device are described in detail below with reference to the accompanying drawings.

First Embodiment

Figure 1:
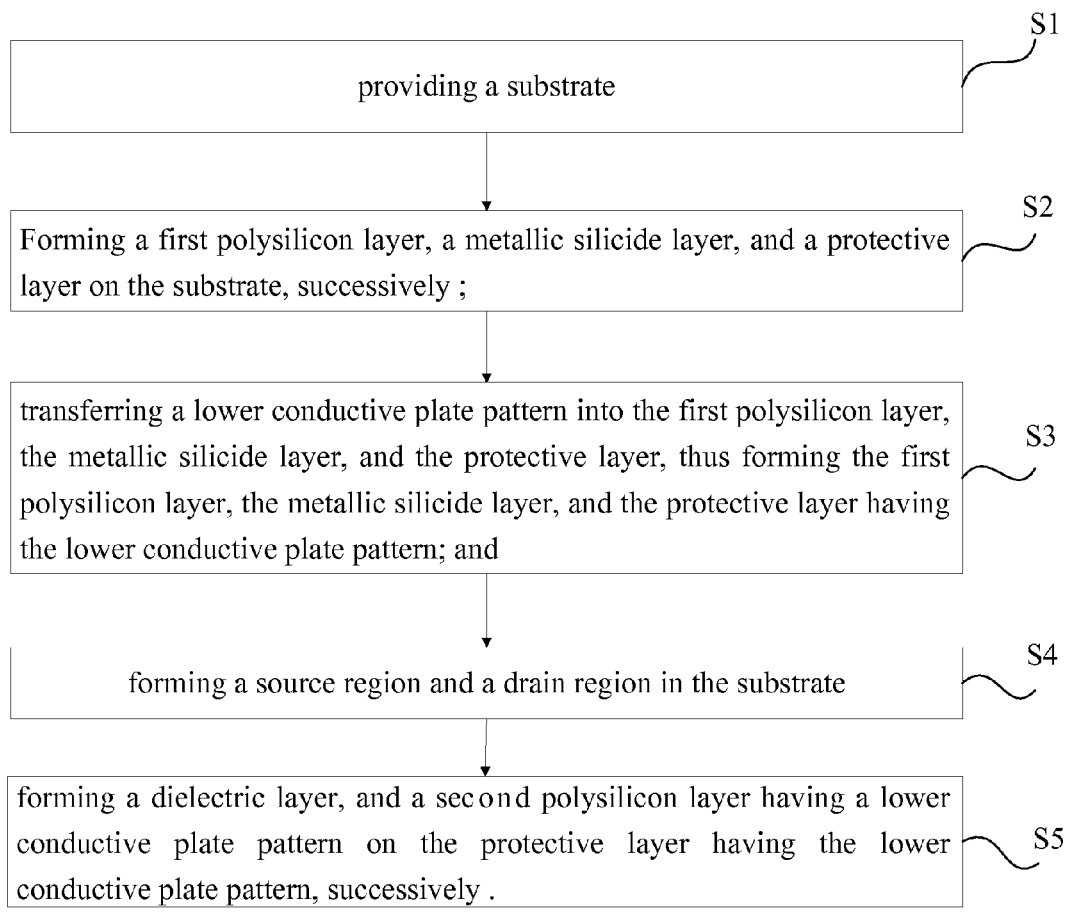
FIG. 1 is a flow chart of a method of manufacturing a semiconductor device according to an embodiment of the present disclosure.

FIG. 1 is a flow chart of a method of manufacturing a semiconductor device according to an embodiment of the present disclosure; the method includes the steps of:

Step S1, a substrate is provided.

In the illustrated embodiment, the substrate is made of silicon. In alternative embodiments, the substrate can be made of germanium, indium phosphide, or gallium arsenide and the like.

Step S2, a first polysilicon layer, a metallic silicide layer, and a protective layer are formed successively on the substrate.

Figure 2:
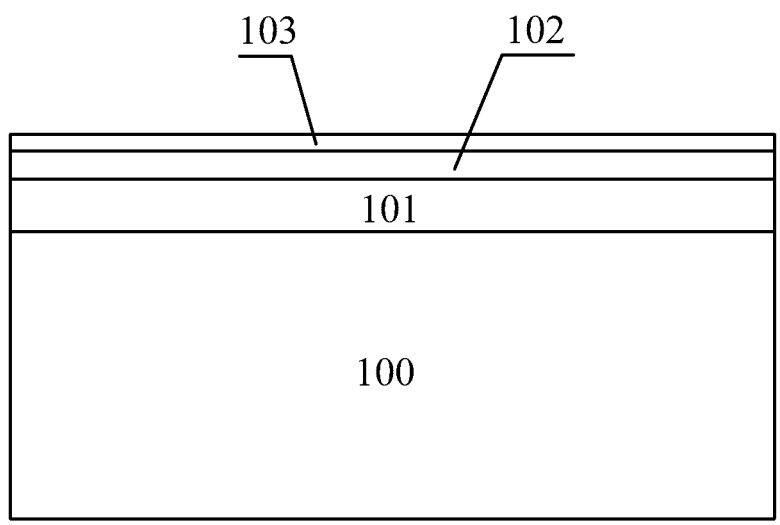
FIG. 2 to FIG. 7 are cross-sectional views of the semiconductor device during the manufacturing process according to an embodiment of the present disclosure.

Referring to FIG. 2, first of all, the first polysilicon layer 101 is formed on the substrate 100 by a chemical vapor deposition method. The thickness of the first polysilicon layer 101 is about 5000 Å.

A relatively thin metallic silicide layer 102 (e.g., a thickness of 1200 Å) is then formed on the first polysilicon layer 101. The metallic silicide layer 102 can decrease the contact resistance of the subsequently formed gate (or the lower conductive plate polysilicon); and thus the operating speed of the device can be improved. In the illustrated embodiment, the metallic silicide layer 102 is WSi layer.

Finally, a protective layer 103 is formed on the metallic silicide layer 102 by a chemical vapor deposition method. The protective layer 103 is used to prevent the metallic silicide layer 102 from being damaged during the subsequent process. The thickness of the protective layer 103 can be 100 Å to 500 Å. Preferably, the thickness of the protective layer 103 can be 200 Å to 300 Å by controlling the deposition time. In the illustrated embodiment, the protective layer 103 is the third polysilicon layer; in alternative embodiments, the protective layer 103 can be made of other material, such as Ti, or TiN and so on.

Step S3, a lower conductive plate pattern is transferred into the first polysilicon layer, the metallic silicide layer, and the protective layer, thus the first polysilicon layer, the metallic silicide layer, and the protective layer having the lower conductive plate pattern are formed.

Figure 3:
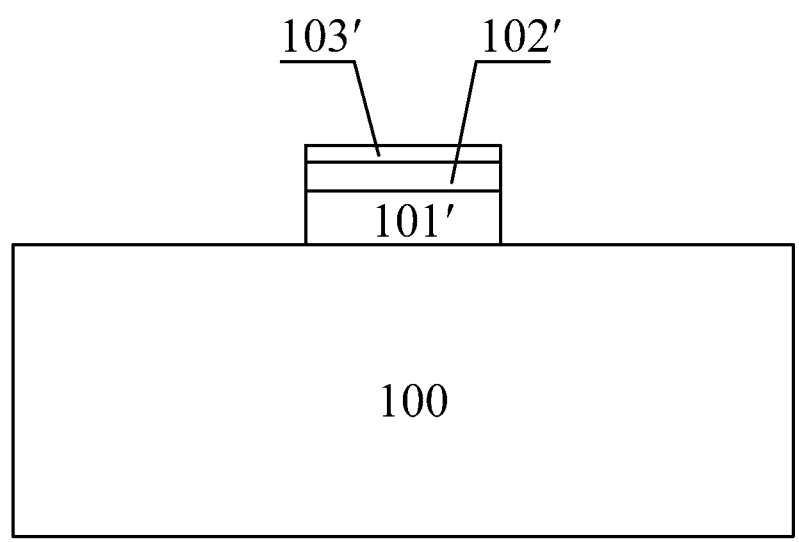

Referring to FIG. 2 and FIG. 3, in this step, the lower conductive plate (gate) pattern (figure) is transferred into the first polysilicon layer 101, the metallic silicide layer 102, and the protective layer 103 by a photolithography and etching process. Specifically, the process is as follows: the protective layer 103 is spin-coated with a photoresist layer (not shown), then the photoresist layer is exposed using a mask having the lower conductive plate pattern, after being developed, the lower conductive plate pattern is transferred into the photoresist layer, then the protective layer 103, the metalic silicide layer 102, and the first polysilicon layer 101 are etched successively using a photoresist layer having the lower conductive plate pattern as a mask; finally, a first polysilicon layer 101', a metalic silicide layer 102', and a protective layer 103' having the lower conductive plate pattern are formed successively on the substrate 100.

In the illustrated embodiment, the protective layer 103 is formed on the metalic silicide layer 102 before the photolithography and etching of the first polysilicon layer 101 and the metalic silicide layer 102 on the first polysilicon layer 101. Therefore, the protective layer 103 can prevent the metalic silicide layer 102 from being damaged during the photolithography and etching process, the flatness of the surface of metalic silicide layer 102' having the lower conductive plate pattern can be ensured, which is the foundation of the subsequently formed PIP capacitor with high capacitance and high reliability.

Step S4, a source region and a drain region are formed in the substrate.

The step further includes the steps of:

Step S41, a lightly doped drain is formed in the substrate.

Figure 4:
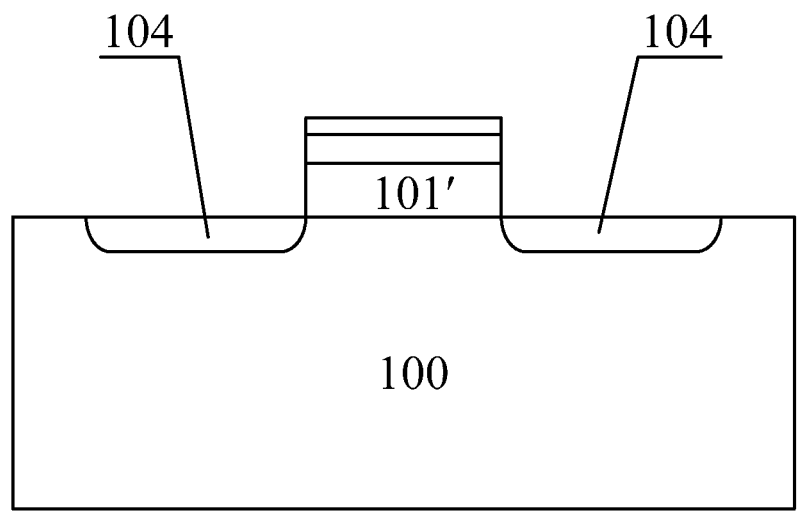

Referring to FIG. 4, first of all, the substrate 100 is spin-coated with a photoresist layer (not shown), then the photoresist layer is exposed using a mask having a source region pattern and drain region pattern, after being developed, the source region pattern and drain region patterns are transferred into the photoresist layer. A lightly doped drain 104 is formed in the substrate 100 by ion implantation process via using the photoresist layer having the source region and drain region patterns as the mask. The injection dose of the ion is small during the formation of the lightly doped drain 104, thus the doped region is called the lightly doped drain region 104. The lightly doped drain region 104 is located in the substrate located on both sides of the first polysilicon 101' layer having the lower conductive plate pattern.

Step S42, a sidewall is formed on both sides of the first polysilicon layer, the metallic silicide layer, and the protective layer having the lower conductive plate pattern.

Figure 5:
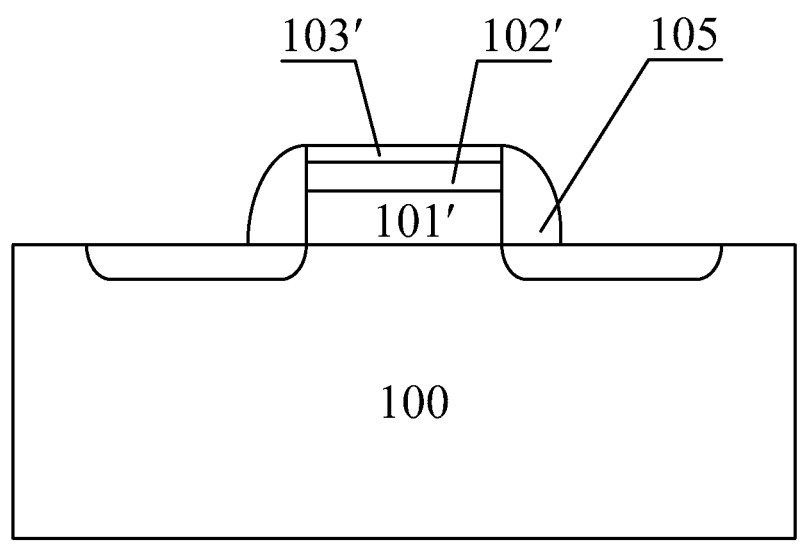

Referring to FIG. 5, first of all, the surface of the substrate 100 is deposited with a layer of silicon oxide (not shown), then the silicon oxide layer is reversely-etched away by dry etching, no mask is needed during the process of reverse-etching, the reverse-etching is completed when the protective layer 103' having the lower conductive plate pattern is exposed. The result of the reverse-etching is: most of the silicon oxide is etched away, only the silicon oxide located on the both sides of the first polysilicon layer 101', the metalic silicide layer 102', and the protective layer 103' having the lower conductive plate pattern is retained, the retained silicon oxide is the sidewall 104.

The formation of the sidewall 104 can prevent the punch-through of the source region and the drain region due to large dose of source and drain implanted too close to the channel.

Step S43, a source region and a drain region are formed in the substrate.

Figure 6:
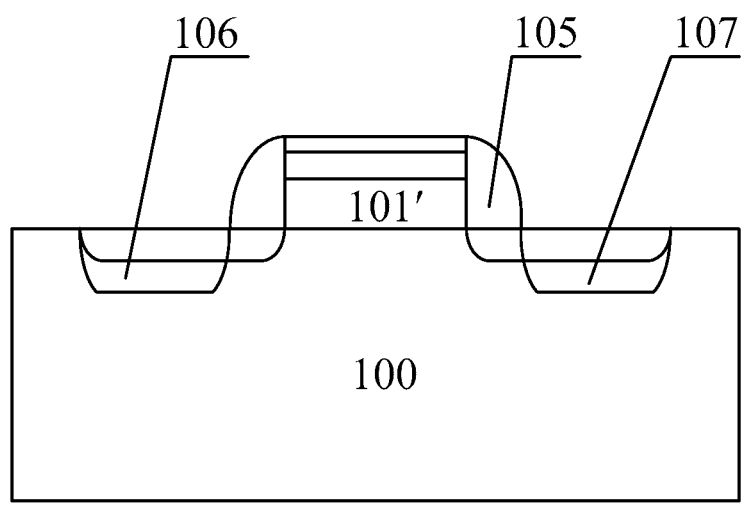

Referring to FIG. 6, the substrate 100 is spin-coated with a photoresist layer (not shown), then the photoresist layer is exposed using a mask having a source region and drain region pattern, after being developed, the source region and drain region patterns are transferred into the photoresist layer. The source region 106 and the drain region 107 are formed in the substrate 100 by ion implantation process via using the photoresist layer having the source region and drain region patterns as the mask. The injection dose of the ion is relatively great during the formation of the source region 106 and the drain region 107, the sidewall 105 is formed on the both sides of the first polysilicon layer 101' having the lower conductive plate pattern before this step, thus sidewall 105 can prevent a large dose of ion from intruding into the narrow channel.

Step S43, the substrate is annealed.

The injection ion can be activated, and the lattice defect caused during the ion implantation process can be repaired in the step.

In the illustrated embodiment, the protective layer is formed on the metalic silicide layer, thus the metalic silicide layer is not effected by the annealing process, and it can prevent the metalic silicide layer from being warped or peeled, which is the foundation of the subsequently formed PIP capacitor with high capacitance and high reliability.

Step S5, a dielectric layer and a second polysilicon layer having a lower conductive plate pattern are formed successively on the protective layer having the lower conductive plate pattern.

Figure 7:
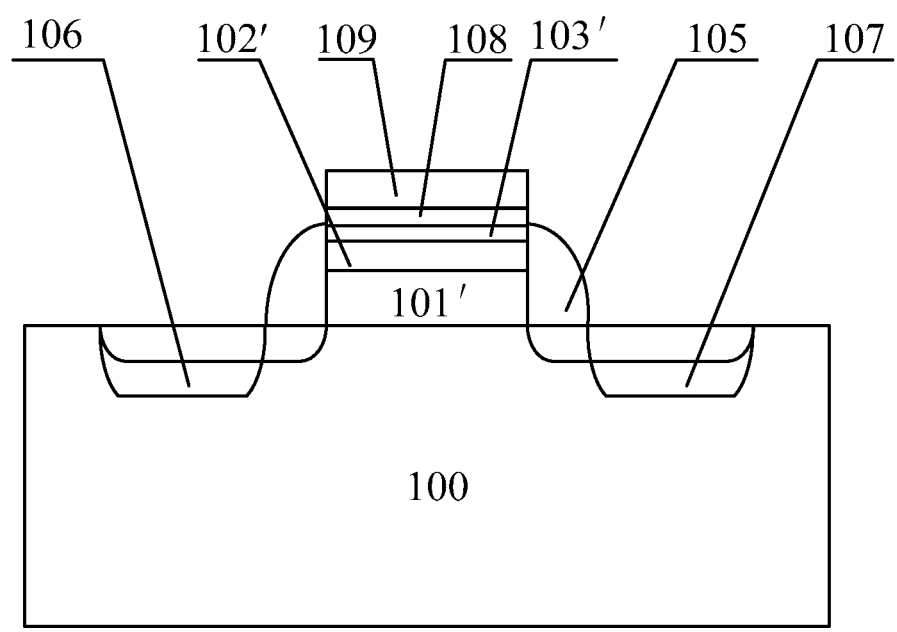

Referring to FIG. 7, first of all, the dielectric layer and the second polysilicon layer are deposited successively on the protective layer, then the lower conductive plate pattern (or the upper conductive plate pattern, in the illustrated embodiment, the upper conductive plate pattern is the same as the lower conductive plate pattern) is transferred into the dielectric layer and the second polysilicon layer, thus the dielectric layer 108, and the second polysilicon layer 109 having the lower conductive plate pattern are formed on the protective layer 103' having the lower conductive plate pattern. The second polysilicon layer 109 having the lower conductive plate pattern is the upper conductive plate polysilicon of the PIP capacitor.

The dielectric layer can be a single dielectric layer, such as silicon oxide layer; or it can also be a stacked dielectric layer, such as ONO layer (i.e. bottom oxide layer, middle nitride layer, and top silicon oxide layer).

In the illustrated embodiment, the method of manufacturing the semiconductor device is improved on the basis of the first process of the prior art, the protective layer is formed on the metalic silicide layer, thus it can prevent the metalic silicide layer from being effected by the subsequent process of etching and heat treatment, etc. The metalic silicide layer can remain the same and have great flatness and uniformity, therefore, the capacitance of the PIP capacitor is improved, and the reliability of the PIP capacitor is also improved.

Second Embodiment

Figure 8:
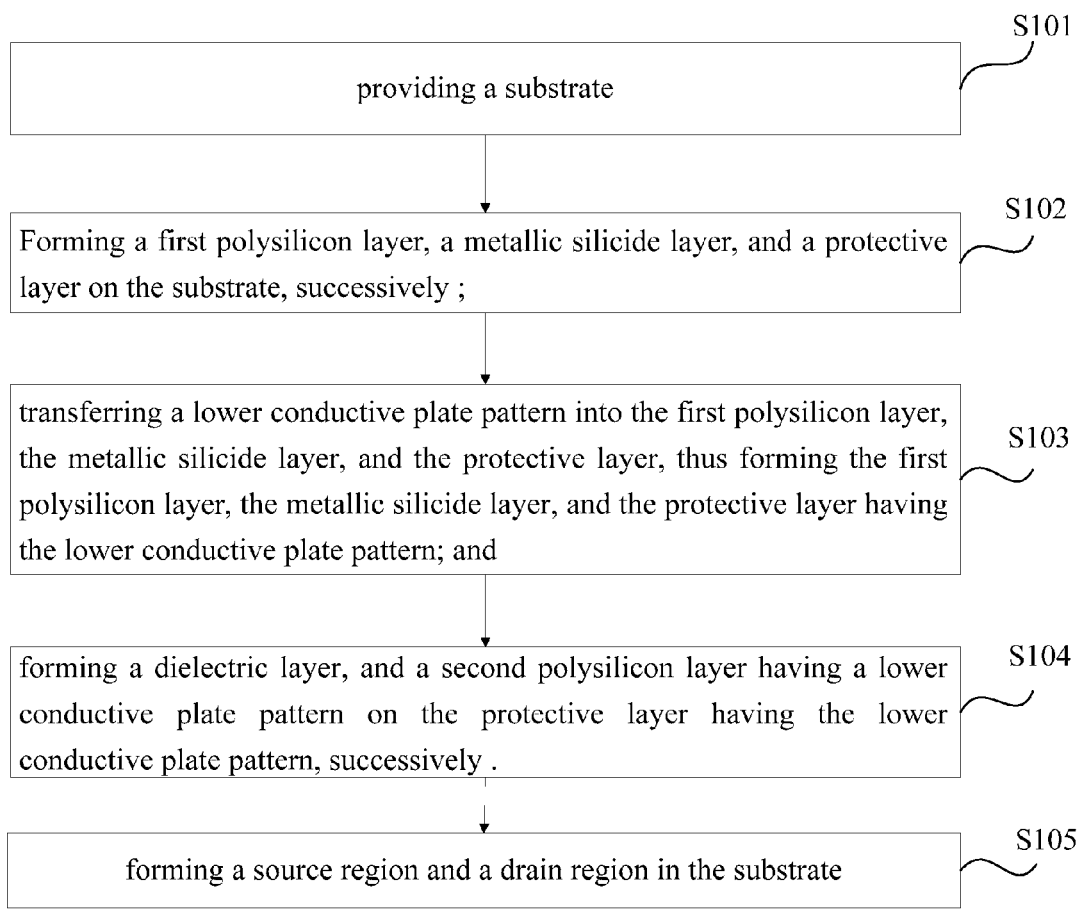
FIG. 8 is a flow chart of a method of manufacturing a semiconductor device according to another embodiment of the present disclosure.

The method in the illustrated embodiment is improved for the second process of the prior art. FIG. 8 is a flow chart of a method of manufacturing a semiconductor device according to the illustrated embodiment of the present disclosure. The method includes the steps of:

Step S101, a substrate is provided.

Step S102, a first polysilicon layer, a metallic silicide layer, and a protective layer are formed successively on the substrate.

Step S103, a lower conductive plate pattern is transferred into the first polysilicon layer, the metallic silicide layer, and the protective layer, thus the first polysilicon layer, the metallic silicide layer, and the protective layer having the lower conductive plate pattern are formed.

Step S104, a dielectric layer, and a second polysilicon layer having a lower conductive plate pattern are formed successively on the protective layer having the lower conductive plate pattern.

Step S105, a source region and a drain region are formed in the substrate.

In the method of manufacturing the semiconductor device of the illustrated embodiment, the protective layer is formed on the metalic silicide layer, thus it can prevent the metalic silicide layer from being damaged during the subsequent process of etching and heat treatment, etc. Therefore, the capacitance of the PIP capacitor is improved, and the reliability of the PIP capacitor is also improved.

Compared to the first embodiment, in the illustrated embodiment, firstly, the PIP capacitor is formed on the substrate, and then the source region and the drain region are formed. Accordingly, the capacitance of the PIP capacitor is greater than that of the PIP capacitor according to the method provided in the first embodiment.

It should be noted that, both embodiments described above can be implemented. The semiconductor with large size and less required capacitance can be formed by the first method. The semiconductor with small size and much required capacitance can be formed by the second method.

Example 3

The method of manufacturing the semiconductor device is described in detail above. The semiconductor device of the present disclosure is described in detail as follows.

Referring to FIG. 7, the semiconductor device of the present disclosure includes: the substrate 100, and the PIP capacitor on the substrate 100. The PIP capacitor further includes: the first polysilicon layer 101', the metalic silicide layer 102', the protective layer 103', the dielectric layer 108, and the second polysilicon layer 109, which have the lower conductive plate pattern. The first polysilicon layer 101', and the second polysilicon layer 109 having the lower conductive plate pattern are regarded as the lower conductive plate and the upper conductive plate of PIP capacitor, respectively.

The semiconductor device of the present disclosure further includes a sidewall 105, a source region 106, and a drain region 107. The sidewall 105 is located on the both sides of the first polysilicon layer 101', the metalic silicide layer 102', and the protective layer 103' having the lower conductive plate pattern. The source region 106 and the drain region 107 are located in the substrate 100 located on the both sides of the sidewall 105.

In the illustrated embodiment, the protective layer 103' is the third polysilicon layer. The thickness of the protective layer 103' is 100 Å to 500 Å. Preferably, the thickness of the protective layer 103' is 200 Å to 300 Å.

The dielectric layer 108 can be a single dielectric layer, such as silicon oxide; or the dielectric layer 108 can be a stacked dielectric layer, such as ONO layer (i.e. bottom oxide layer, middle nitride layer, and top silicon oxide layer).

The sidewall 105 is made of silicon oxide. The metallic silicide layer 102' is WSi layer.

It can be seen from the foregoing technical solution that, in the semiconductor device provided in the present disclosure, the protective layer is formed between the metallic silicide layer and the dielectric layer, thus the damage or the uneven phenomenon of the metallic silicide layer during the subsequent etching or heat treatment can be avoided due to the protective layer, and thus the capacitance and the reliability of the PIP capacitor are improved.

The semiconductor device and the method of manufacturing the semiconductor device of the embodiments of the present disclosure focus on different points, the relevant or similarities of each embodiment can be cross-reference to each other.

It should be noted that, in this context, The terms "first," "second," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of manufacturing a semiconductor device, comprising the steps of:
    providing a substrate;
    forming a first polysilicon layer, a metallic silicide layer, and a protective layer on the substrate, successively;
    transferring a lower conductive plate pattern into the first polysilicon layer, the metallic silicide layer, and the protective layer, thus forming the first polysilicon layer, the metallic silicide layer, and the protective layer having the lower conductive plate pattern;
    forming a source region and a drain region in the substrate; and
    forming a dielectric layer and a second polysilicon layer having a lower conductive plate pattern on the protective layer having the lower conductive plate pattern, successively, wherein the source region and the drain region in the substrate are formed before the dielectric layer and the second polysilicon layer having a lower conductive plate pattern.

2. The method according to claim 1, wherein a thickness of the protective layer is 100 Å to 500 Å.

3. The method according to claim 1, wherein the first polysilicon layer, the metallic silicide layer, and the protective layer are arranged successively from bottom to top.

* * * * *